United States Patent
Yoo

(10) Patent No.: US 6,759,830 B2
(45) Date of Patent: Jul. 6, 2004

(54) METHOD OF PRECISELY ESTIMATING EFFECTIVE FULL-CHARGE CAPACITY OF SECONDARY BATTERY

(75) Inventor: Chang-hyun Yoo, Suwon (KR)

(73) Assignee: Samsung SDI Co., Ltd., Suwon (KR)

( * ) Notice: Subject to any disclaimer, the term of this patent is extended or adjusted under 35 U.S.C. 154(b) by 2 days.

(21) Appl. No.: 10/268,805

(22) Filed: Oct. 11, 2002

(65) Prior Publication Data

US 2003/0071599 A1 Apr. 17, 2003

(30) Foreign Application Priority Data

Oct. 17, 2001 (KR) ........................................ 2001-63948

(51) Int. Cl.⁷ ............................................... H02J 7/00
(52) U.S. Cl. ..................................................... 320/132
(58) Field of Search ................................. 320/132, 130, 320/133, 134, 135

(56) References Cited

U.S. PATENT DOCUMENTS

| 5,545,969 | A | | 8/1996 | Hasegawa | 320/134 |
| 5,808,444 | A | * | 9/1998 | Saeki et al. | 320/117 |
| 6,157,169 | A | * | 12/2000 | Lee | 320/132 |
| 6,456,948 | B1 | | 9/2002 | Lim | 702/63 |
| 6,483,274 | B2 | * | 11/2002 | Lee | 320/132 |

* cited by examiner

Primary Examiner—Pia Tibbits
(74) Attorney, Agent, or Firm—Leydig, Voit & Mayer, Ltd.

(57) ABSTRACT

The invention provides a method of precisely estimating the effective full-discharge capacity of a secondary battery. That effective full-discharge capacity degrades as the secondary battery is repeatedly charged and discharged. The method includes sequentially fully charging a reference secondary battery and fully discharging the reference secondary battery until the reference secondary battery is dead, n times, and simultaneously measuring (i) a constant-voltage period in which the voltage of the reference secondary battery is essentially constant each time the reference secondary battery is fully charged and (ii) full discharge capacity of the reference secondary battery each time the reference secondary battery is fully charged, and storing the constant-voltage periods and corresponding full-discharge capacities measured; and measuring the constant-voltage period each time a secondary battery, essentially identical to the reference secondary battery, is charged, searching the constant-voltage periods stored for the reference secondary battery for the full-discharge capacity corresponding to the constant-voltage period measured for the secondary battery, and setting, for the secondary battery, as an effective full-discharge capacity, the full-discharge capacity of the reference secondary battery stored and corresponding to the constant-voltage period of the secondary battery that has been measured.

3 Claims, 5 Drawing Sheets

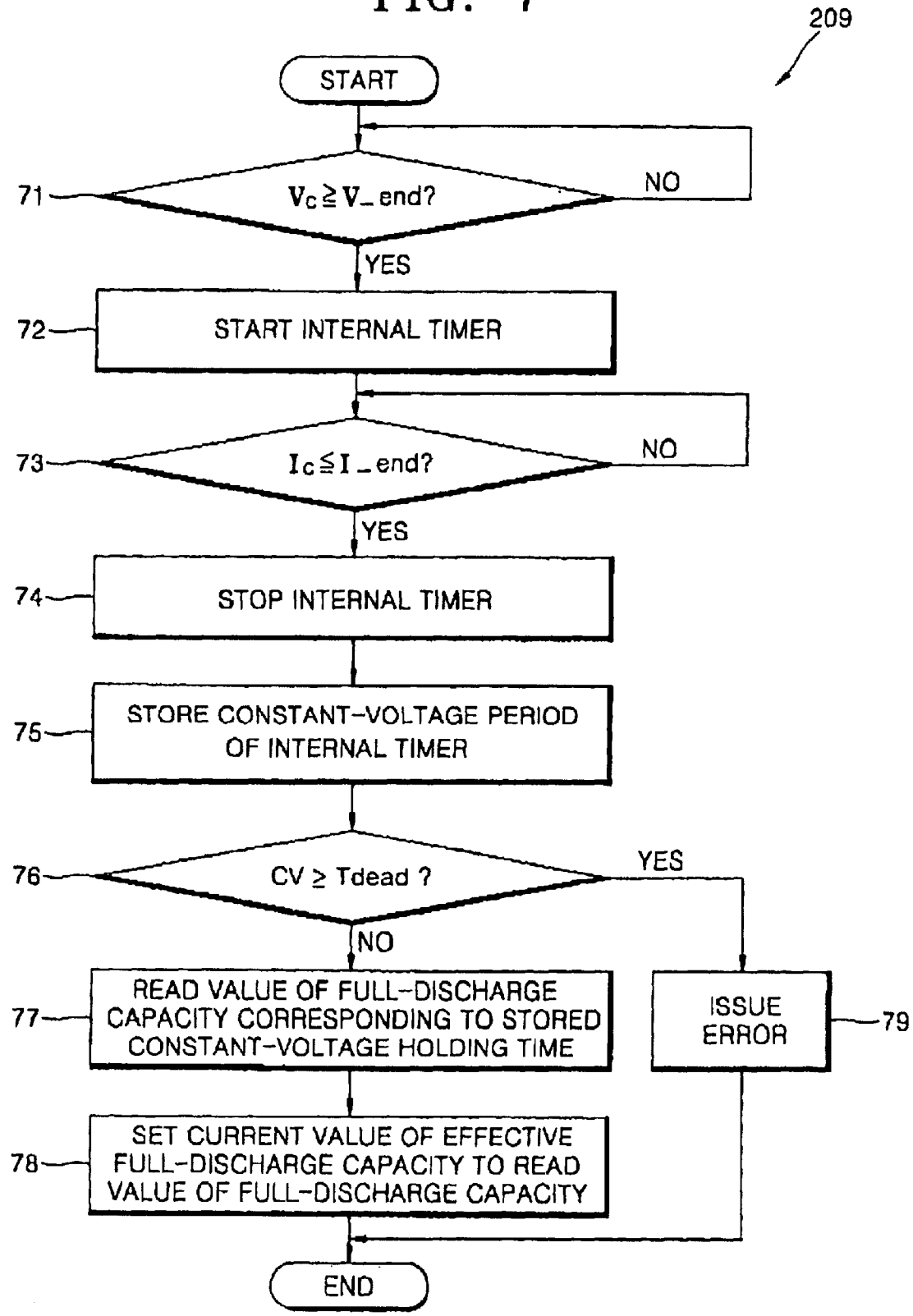

METHOD OF PRECISELY ESTIMATING EFFECTIVE FULL-CHARGE CAPACITY OF SECONDARY BATTERY

CROSS-REFERENCE TO RELATED APPLICATIONS

This application is based upon and claims priority from Korean Patent Application No. 01-63948 filed Oct. 17, 2001, the contents of which are incorporated by reference.

BACKGROUND OF THE INVENTION

1. Field of the Invention

The present invention relates to a method of precisely estimating the effective full-discharge capacity of a secondary battery which decreases in proportion to the degradation of the secondary battery.

2. Description of the Related Art

Secondary batteries are widely used in portable electronic apparatus, such as laptop computers, mobile phones, and camcorders. The charge and discharge states of such a secondary battery can be precisely monitored by determining the relative charging rate, which decreases in proportion to the degradation of the secondary battery. Precise data must be used to monitor and control the charge and discharge states of a secondary battery. Conventionally, this data is produced by periodically estimating and updating effective discharging capacity of the secondary battery.

In the conventional method of estimating effective full-discharging capacity of a secondary battery, which decreases in proportion to the degradation of the battery, only the number of charges and discharges of the battery are counted. Effective full-discharge capacity is estimated to be inversely proportional to the number of times the secondary battery has been charged and discharged. Conventionally, users charge secondary batteries that are partially discharged, i.e., from various different charge states, lowering the precision of the estimation of the full-discharging capacity of the secondary battery. The consequent imprecise estimation of the effective full-discharge capacity prevents precise monitoring of the charge state of the secondary battery, causing inconvenience in use of the battery.

SUMMARY OF THE INVENTION

To solve the above-described problems, it is an object of the present invention to provide a method of precisely estimating the effective full-discharge capacity of a secondary battery independent of the charging and discharging styles of users.

A method according to the invention includes sequentially fully charging a reference secondary battery and fully discharging the reference secondary battery until the reference secondary battery is dead, n times, and simultaneously measuring (i) a constant-voltage period in which the voltage of the reference secondary battery is essentially constant each time the reference secondary battery is fully charged and (ii) full discharge capacity of the reference secondary battery each time the reference secondary battery is fully charged, and storing the constant-voltage periods and corresponding full-discharge capacities measured; and measuring the constant-voltage period each time a secondary battery, essentially identical to the reference secondary battery, is charged, searching the constant-voltage periods stored for the reference secondary battery for the full-discharge capacity corresponding to the constant-voltage period measured for the secondary battery, and setting, for the secondary battery, as an effective full-discharge capacity, the full-discharge capacity of the reference secondary battery stored and corresponding to the constant-voltage period of the secondary battery that has been measured.

Preferably, the secondary battery is packaged with a microcomputer and the method includes searching the constant voltage periods stored for the reference secondary battery and setting the effective full-discharge capacity of the secondary battery with the microcomputer.

One application of the method includes, in setting the effective full-discharge capacity of the secondary battery upon charging of the secondary battery starting an internal timer when voltage of the secondary battery reaches an upper limit voltage indicating beginning of a constant-voltage period; stopping the internal timer when charging current supplied to the secondary battery declines to a lower limit current; and searching the constant-voltage periods of the reference secondary battery stored to obtain the full-discharge capacity corresponding to an elapsed time measured by the internal timer as a constant-voltage period, and setting the effective full-discharge capacity of the secondary battery to the full-discharge capacity of the reference secondary battery corresponding to the constant-voltage period measured as elapsed time by the internal timer.

BRIEF DESCRIPTION OF THE DRAWINGS

The above object and advantages of the present invention will become more apparent by describing in detail a preferred embodiment with reference to the attached drawings in which:

FIG. 7 is a flowchart illustrating the execution of a charging mode in a method according to an embodiment of the present invention.

DETAILED DESCRIPTION OF THE INVENTION

Figure 1:
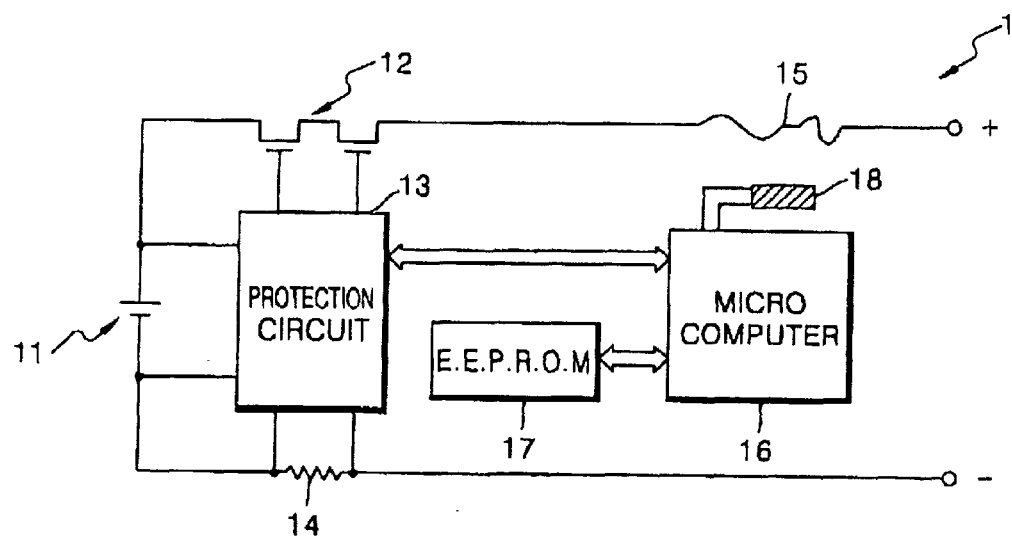
FIG. 1 is a block diagram showing the internal structure of a secondary battery pack to which a method according to the present invention may be applied.

Referring to FIG. 1, a secondary battery pack 1, to which the present invention may be applied, includes a secondary battery 11, field effect transistors (FETs) 12, a protection circuit 13, a resistor 14, a protection device 15, a microcomputer 16, an electrically erasable programmable read only memory (EEPROM) 17, and a thermistor 18.

The FETs 12 are turned on and off by a control signal from the protection circuit 13, controlling charging and discharging of the secondary battery 11. The protection circuit 13 measures the instantaneous voltage of the secondary battery 11 and measures the instantaneous current of the secondary battery 11 by measuring the current flowing through the resistor 14. The measured instantaneous current and voltage are transmitted as digital data to the microcomputer 16. The protection circuit 13 turns the FETs 12 on and off according to the control signal received from the microcomputer 16. The protection device 15 prevents overcharging and over-discharging in the event that the FETs 12 do not operate smoothly.

The microcomputer 16, in performing an algorithm according to a method of the present invention, receives the measured instantaneous voltage and current from the protection circuit 13 and ambient temperature from the thermistor 18 and generates data used to monitor and control the charge and discharge states of the secondary battery 11. The control data is transmitted to the protection circuit 13.

Figure 2:
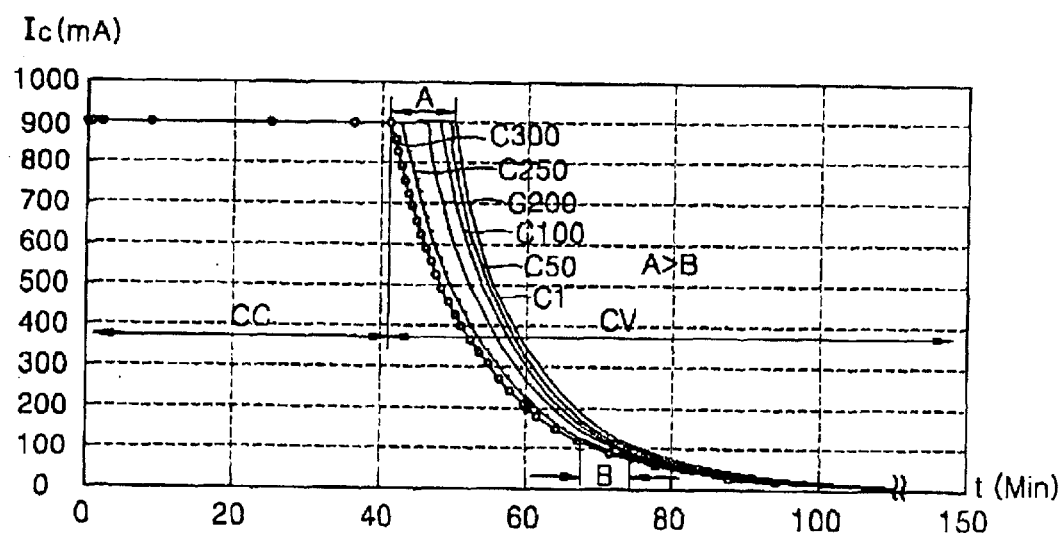
FIG. 2 is a graph showing the characteristics of charge current with respect to time acquired by repeatedly fully charging a secondary battery.
Figure 3:
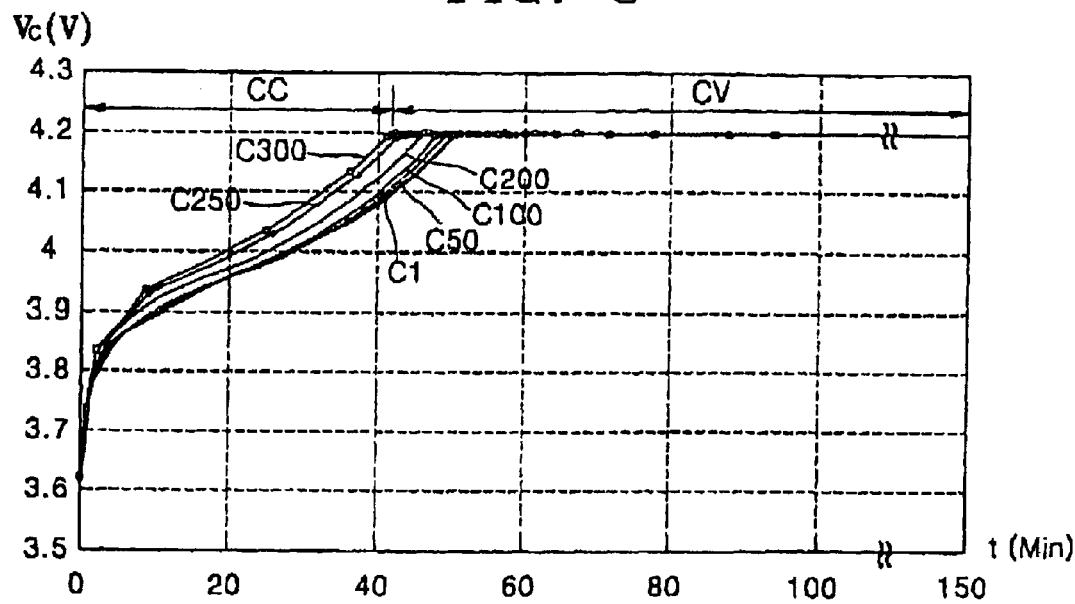
FIG. 3 is a graph showing the characteristics of charge voltage with respect to time acquired by repeatedly fully charging the secondary battery.
Figure 4:
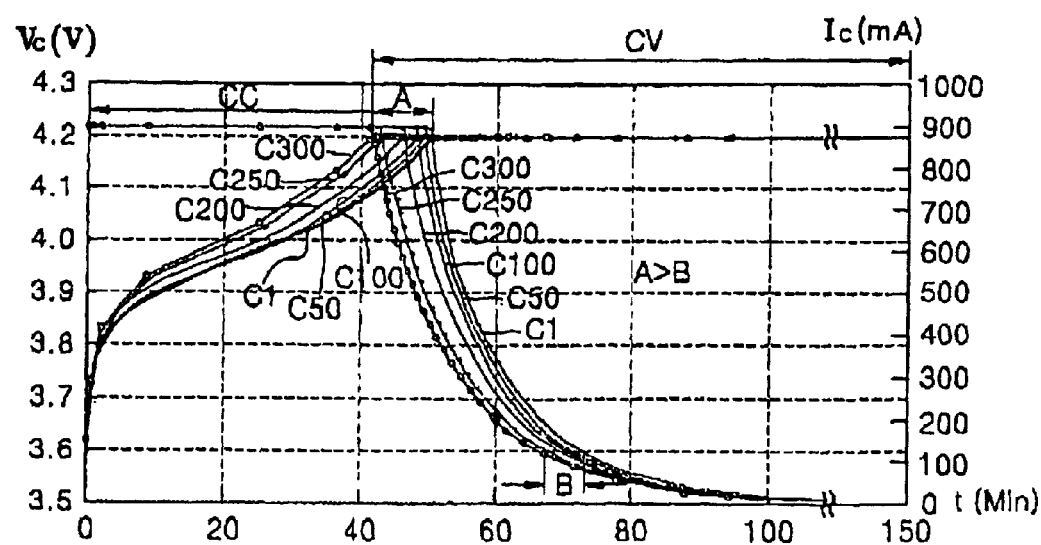
FIG. 4 is a combination of the graphs of FIGS. 2 and 3.

FIG. 2 is a graph showing characteristics of charging current, Ic, with respect to time t, obtained by repeatedly fully charging a secondary battery. FIG. 3 is a graph showing characteristics of charging voltage, Vc, with respect to time that are acquired by repeatedly fully charging the secondary battery. FIG. 4 is a combination of the graphs of FIGS. 2 and 3. In FIGS. 2–4, CC denotes a constant current period during which an essentially constant current flows out of or into the secondary battery although the voltage of the battery is changing. CV denotes a constant voltage period when the voltage of the secondary battery is essentially constant, although the charging current is changing.

The characteristics plotted in FIGS. 2–4 are obtained by charging and discharging a secondary battery 300 times. The characteristics appearing in FIGS. 2–4 are the measured characteristics for different numbes of charges and discharges. Lines C1 represent a single charge and discharge, lines C50, 50 charges and discharges, lines C100, 100 charges and discharges, lines C200, 200 charges and discharges, lines C250, 250 charges and discharges, lines C300, 300 charges and discharges.

Reference character A in FIGS. 2 and 4 indicates the difference in times when the constant current period starts. As is apparent from those figures, the larger the number of times the secondary battery is charged, the shorter is the constant current period, CC. The reduction in the duration of the constant current period, CC, is an indication of the degradation of the secondary battery. Reference character B, also appearing in FIGS. 2 and 4, indicates the change in times when holding of a constant voltage enters the latter part of the constant voltage period, CV. These graphs indicate that the constant voltage period begins earlier as the degradation of the secondary battery increases. FIGS. 2 and 4 indicate that the time difference A is larger than the time difference B and that the constant voltage period always ends at nearly the same time.

Through experiment, it was determined that as the time required for full charging of the secondary battery increases, the constant current period, CC, becomes shorter and the constant voltage period, CV, becomes longer. In other words, the experiments prove that the constant voltage period CV is proportional to the number of times the secondary battery is charged and discharged. This relationship can be used very effectively to estimate precisely the effective full-discharge capacity of the secondary battery, which decreases in proportion to the degradation of the secondary battery. This relationship is important because users typically begin charging of secondary batteries from different charge states but most of the users continue the charging until the secondary battery reaches the fully charged state. Stated another way, although the constant current period CC varies, depending upon battery condition, the constant voltage period CV can be measured independent of battery charge state and still indicate the full discharge capacity of the secondary battery.

Figure 5:
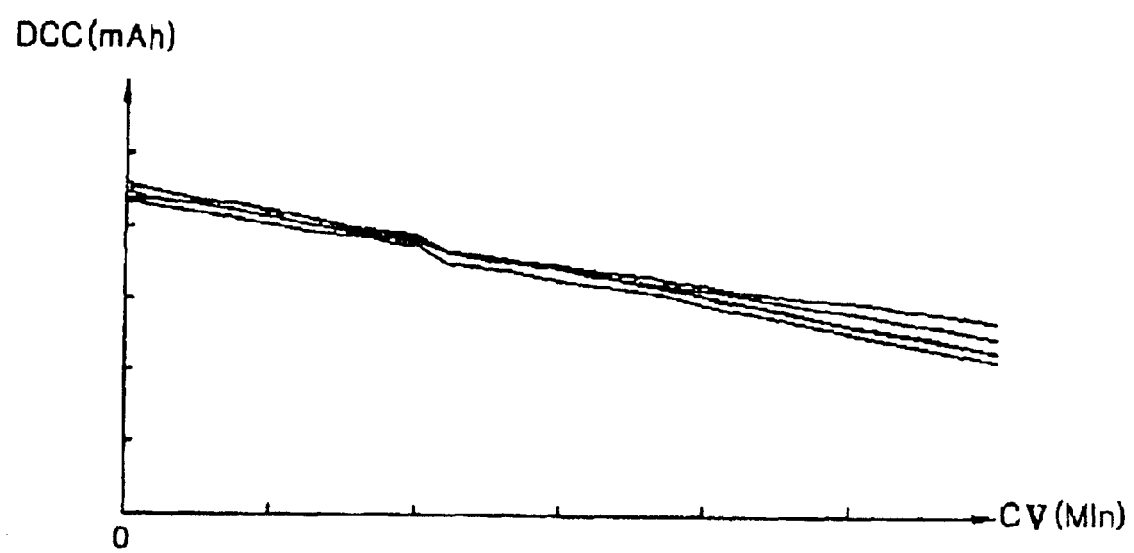
FIG. 5 is a graph showing the characteristics of full-discharge capacity with respect to constant-voltage period obtained by repeatedly fully charging and fully discharging the secondary battery.

In a battery pack, such as the embodiment illustrated in FIG. 1, the constant voltage period CV can be indirectly measured from the duty ratio of the system clock pulses of the microcomputer 16, because the duty ratio is inversely proportional to the constant voltage period CV. FIG. 5 is a graph showing the full-discharge capacity, DCC, of the secondary battery with respect to the constant voltage period, CV. FIG. 5 is obtained by repeatedly fully charging and fully discharging the secondary battery pack of FIG. 1. FIG. 5 demonstrates that the constant voltage period CV is substantially inversely proportional to the full-discharge capacity DCC.

The characteristics of the secondary battery as illustrated in FIGS. 2–5 can be tabulated in the form of the following table.

TABLE 1

| Number of full charges and full discharges | Full-charging time | | Full-charge capacity | Full-discharge capacity (DCC) | Full-discharge voltage | others |
|---|---|---|---|---|---|---|
| | CC | CV | | | | |
| 1 | | | | | | |
| 2 | | | | | | |
| 3 | | | | | | |
| ... | | | | | | |
| ... | | | | | | |
| 500 | | | | | | |

Of the data entered in the Table, only the constant voltage CV and full-discharge capacity DCC, with respect to the number of full charge and full discharge cycles, are required to estimate the effective full-discharge capacity of the secondary battery. Therefore, in applying this information to a secondary battery according to the invention, these data are recorded in a look-up table and used to estimate precisely the effective full-discharge capacity of a secondary battery having the same construction as the secondary battery from which the data for constructing the look-up table is obtained.

Figure 6:
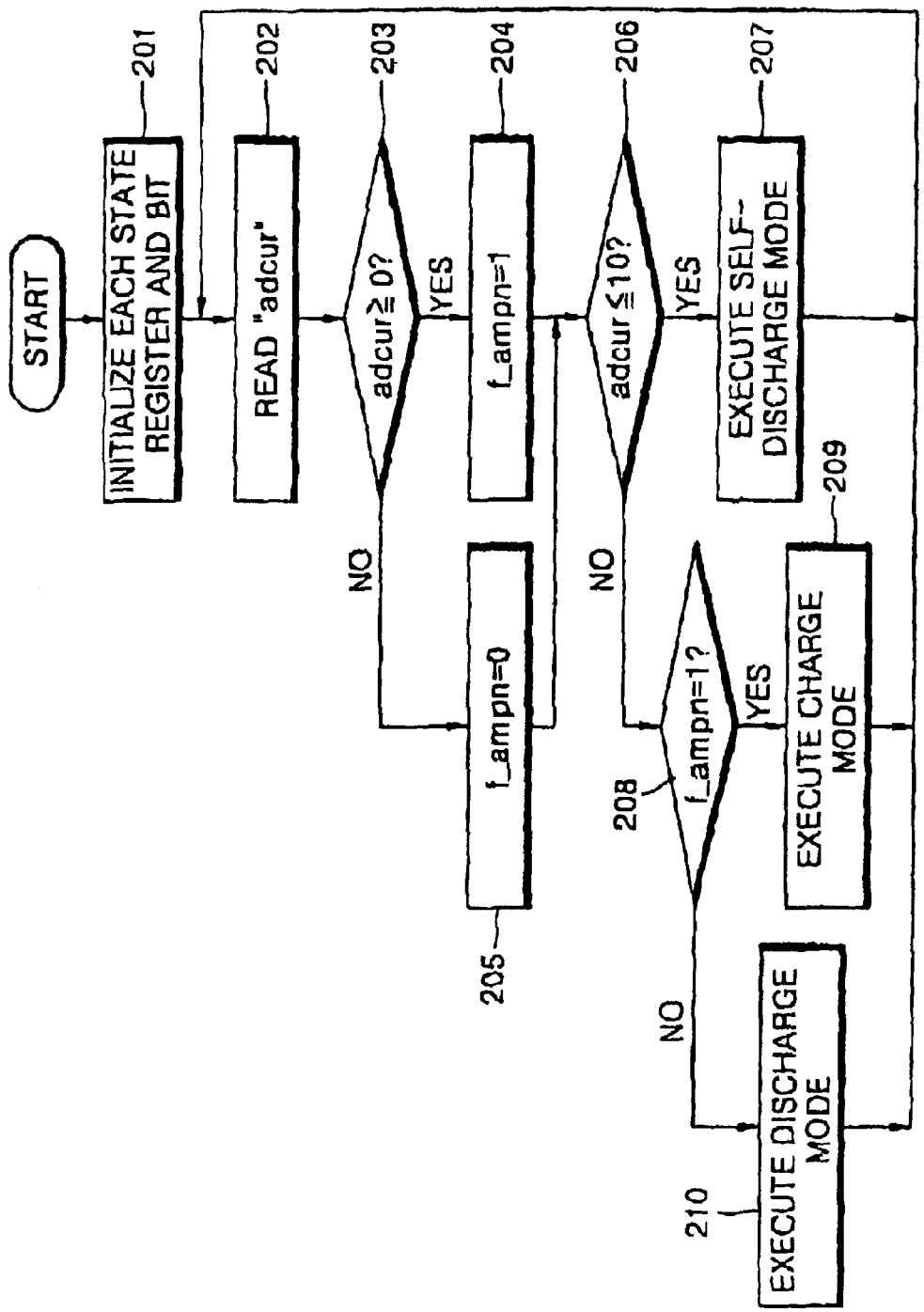
FIG. 6 is a flowchart illustrating the basic algorithm of the microcomputer of the secondary battery pack of FIG. 1.

FIG. 6 is a flowchart illustrating the basic algorithm of the microcomputer of the secondary battery pack of FIG. 1. Referring to FIG. 6, the state registers and bits within the microcomputer 16 are first initialized in step 201. Next, one of a charge mode, a discharge mode, and a self-discharge mode is selected and executed, depending on the magnitude and sign of "adcur", the instantaneous current flowing through the secondary battery 11, in steps 202 through 209. The steps 202 through 209 are repeated, and each of them is described below in detail.

The instantaneous current "adcur" is read in step 202. It is determined in step 203 whether the instantaneous current "adcur" is greater than or equal to 10 mA (milliamperes). If so, a charge/discharge data bit f_ampn is set to be 1 in step 204 so that the charge mode is indicated. If it is determined in step 203 that the instantaneous current value "adcur" is smaller than 0 mA, then the charge/discharge data bit f_ampn is set to be 0 in step 205 so that a discharge mode is indicated. Thereafter, it is determined in step 206 whether the instantaneous current is no larger than 10 mA. If so, the self-discharge mode is executed in step 207. If the instantaneous current "adcur" is larger than 10 mA, the charge/discharge data bit f_ampn is tested in step 208. If it is determined in step 208 that the charge/discharge data bit f_ampn is 1, the charge mode is executed, in step 209. If the charge/discharge data bit f_ampn is 0, the discharge mode is executed in step 210. An effective full-discharge capacity estimation algorithm according to the present invention is performed in step 209 in executing the charge mode.

FIG. 7 is a flowchart illustrating the charge mode execution routine 209 according to an embodiment of the present invention. First, it is determined in step 71 whether the present charge voltage Vc is greater than or equal to an upper limit voltage V_end. That is, it is determined whether the constant-voltage period CV has begun. If the present charge voltage Vc is greater than or equal to the upper limit voltage V_end, an internal timer starts in step 72. Thereafter, it is determined in step 73 whether the present charge current Ic is smaller than or equal to a lower limit current I_end. That is, it is determined whether the constant-voltage period CV has begun, so that the time for concluding full discharging has arrived. If the charge current Ic at the present time is smaller than or equal to the lower limit current I_end, then the internal timer is stopped in step 74.

The constant-voltage period CV obtained by operating the internal timer is temporarily stored in step 75. Next, if it is determined in step 76 whether the temporarily stored constant-voltage period CV is greater than or equal to an upper limit period Tdead. If so, an error signal is issued in step 79 and the process ends. If it is determined in step 76 that the temporarily stored constant-voltage period CV is smaller than the upper limit period Tdead, the full-discharge capacity corresponding to the stored constant-voltage period CV is read in step 77. Thereafter, the read full-discharge capacity value is set as the effective full-discharge capacity for the present time in step 78.

As described above, in a method of estimating an effective full-discharge capacity according to the present invention, the effective full-discharge capacity is determined based on the constant-voltage period. Accordingly, the effective full-discharge capacity of a secondary battery can be precisely estimated independent of the charging/discharging styles of most battery users for the following reasons.

First, it has been proven from experiments that the constant-voltage period is proportional to the cumulative time of charging and discharging of a secondary battery by a user.

Second, users start charging secondary batteries from different residual capacities but most of the users fully charge the batteries. Accordingly, the constant-current period CC may vary for different battery conditions, but the constant-voltage period CV can be measured for any battery condition.

While this invention has been particularly shown and described with reference to preferred embodiments, it will be understood by those skilled in the art that various changes in form and details may be made without departing from the spirit and scope of the invention as defined by the appended claims.

What is claimed is:

1. A method of estimating full-discharge capacity of a secondary battery, which decreases in proportion to degradation of the secondary battery, the method comprising:

sequentially fully charging a reference secondary battery and fully discharging the reference secondary battery until the reference secondary battery is dead, n times, and simultaneously measuring (i) duration of a constant-voltage period, during charging of the reference secondary battery and in which the voltage of the reference secondary battery is essentially constant, each time the reference secondary battery is fully charged and (ii) full discharge capacity of the reference secondary battery each time the reference secondary battery is fully charged, and storing the constant-voltage periods and corresponding full-discharge capacities measured; and measuring the constant-voltage period each time a secondary battery, having the same construction as the reference secondary battery, is charged, searching the constant-voltage periods stored for the reference secondary battery for the full-discharge capacity corresponding to the constant-voltage period measured for the secondary battery, and setting, for the secondary battery, as an effective full-discharge capacity, the full-discharge capacity of the reference secondary battery stored and corresponding to the constant-voltage period of the secondary battery that has been measured.

2. The method of claim 1 wherein the secondary battery is packaged with a microcomputer and including using the microcomputer for the searching of the constant-voltage periods stored for the reference secondary battery and the setting of the effective full-discharge capacity of the secondary battery.

3. The method of claim 1, including, in the setting of the effective full-discharge capacity of the secondary battery, upon charging of the secondary battery:

starting an internal timer when voltage of the secondary battery reaches an upper limit voltage indicating beginning of a constant-voltage period;

stopping the internal timer when charging current supplied to the secondary battery declines to a lower limit current; and searching the constant-voltage periods of the reference secondary battery stored to obtain the full-discharge capacity corresponding to an elapsed time measured by the internal timer as a constant-voltage period, and setting the effective full-discharge capacity of the secondary battery to the full-discharge capacity of the reference secondary battery corresponding to the constant-voltage period measured as elapsed time by the internal timer.

* * * * *